(12) United States Patent
Staton et al.

(10) Patent No.: US 10,733,918 B2
(45) Date of Patent: Aug. 4, 2020

(54) METHOD OF CONVERTING A STATIC DISPLAY TO A CHANGING DISPLAY

(71) Applicant: NEWTONOID TECHNOLOGIES, L.L.C., Liberty, MO (US)

(72) Inventors: Fielding B. Staton, Liberty, MO (US); David Strumpf, Columbia, MO (US)

(73) Assignee: Newtonoid Technologies, L.L.C., Liberty, MO (US)

( * ) Notice: Subject to any disclaimer, the term of this patent is extended or adjusted under 35 U.S.C. 154(b) by 0 days.

(21) Appl. No.: 16/376,164

(22) Filed: Apr. 5, 2019

(65) Prior Publication Data
US 2019/0311658 A1 Oct. 10, 2019

Related U.S. Application Data (60) Provisional application No. 62/653,037, filed on Apr. 5, 2018.

(51) Int. Cl.
*G09F 9/302* (2006.01)
*H05K 5/00* (2006.01)
(Continued)

(52) U.S. Cl.
CPC .......... *G09F 9/3023* (2013.01); *G06F 3/1446* (2013.01); *G06F 9/3004* (2013.01);
(Continued)

(58) Field of Classification Search
CPC ................. G06F 3/1446; G06F 9/3004; G09F 2023/0025; G09F 27/005; G09F 9/3023;
(Continued)

(56) References Cited

U.S. PATENT DOCUMENTS 1,753,721 A 4/1930 Robinson
1,773,117 A 8/1930 Rahr
(Continued)

FOREIGN PATENT DOCUMENTS

EP 2607420 A1 6/2013

OTHER PUBLICATIONS

PCT Appln. No. PCT/US19/25998, International Search Report and Written Opinion, dated Aug. 22, 2019, 12 pages.
(Continued)

*Primary Examiner* — Chun-Nan Lin
(74) *Attorney, Agent, or Firm* — Avant Law Group, LLC (57) ABSTRACT

A method of converting a static display to a dynamic display includes providing a static display and removing a portion of the display to form a cutout area. A dynamic display sheet is positioned at the cutout area. The dynamic display sheet includes a first layer comprising a plurality of three-dimensional static programmable electrochromic (SPEC) particles; a second layer comprising a positively charged conductive sheet; a third layer comprising a negatively charged conductive sheet; a laminate layer; and a control element comprising a processor for activating the SPEC particles to switch from a first to a second colored state; wherein the second and third layers are respectively positioned on either side of the first layer, and the laminate layer encompasses the first, the second, and the third layers. The dynamic display sheet is activated to cause the SPEC particles to selectively flash between the first and second colored states.

8 Claims, 13 Drawing Sheets

US 10,733,918 B2
Page 2

(51) Int. Cl.
*G06F 9/30* (2018.01)
*G06F 3/14* (2006.01)
*G09G 3/20* (2006.01)

(52) U.S. Cl.
CPC ......... *G09G 3/2003* (2013.01); *H05K 5/0017* (2013.01); *H05K 5/0021* (2013.01)

(58) Field of Classification Search
CPC .... G09F 9/372; G09G 3/2003; H05K 5/0017; H05K 5/0021
See application file for complete search history.

(56) References Cited

U.S. PATENT DOCUMENTS

| | | | |
|---|---|---|---|
| 1,789,443 A | 1/1931 | Levin | |
| 1,852,169 A | 4/1932 | Levy | |
| 2,133,988 A | 10/1938 | Harshberger | |
| 2,229,535 A | 1/1941 | Weber | |
| 2,495,303 A | 1/1950 | Wisniewski | |
| 2,547,371 A | 4/1951 | Brennan | |
| 2,567,554 A | 9/1951 | Davey | |
| 2,796,624 A | 6/1957 | Speer | |
| 2,950,576 A | 8/1960 | Rubenstein | |
| 3,467,973 A | 9/1969 | Minnick | |
| 3,783,568 A | 1/1974 | Adler et al. | |
| 4,020,611 A | 5/1977 | Amos | |
| 4,703,603 A | 11/1987 | Hills | |
| 4,860,851 A | 8/1989 | Krevor | |
| 4,913,576 A | 4/1990 | Grant, Jr. | |
| 5,348,363 A | 9/1994 | Fink | |
| 5,415,700 A | 5/1995 | Arthur | |
| 5,422,712 A | 6/1995 | Ogino | |
| 5,812,300 A | 9/1998 | Coleman | |
| 6,811,880 B1 | 11/2004 | Clough | |
| 6,955,834 B2 | 10/2005 | Rohrbaugh | |
| 7,155,343 B2 | 12/2006 | Grant | |
| 7,444,792 B2 | 11/2008 | Matson | |
| 7,461,726 B2 | 12/2008 | Hawkins et al. | |
| D596,482 S | 7/2009 | Marinucci | |
| 8,303,027 B2 | 11/2012 | Murakami et al. | |
| 9,112,080 B1 | 8/2015 | Corneille | |
| 9,371,669 B2 | 6/2016 | Berg | |
| 9,557,479 B2 | 1/2017 | Suntsova | |
| 9,568,448 B2 | 2/2017 | Gole | |
| 9,575,219 B2 | 2/2017 | Ravichandran | |
| 9,578,434 B2 | 2/2017 | Wang | |
| 9,631,377 B2 | 4/2017 | Browne | |
| 9,675,953 B2 | 6/2017 | Oldenburg | |
| 9,759,286 B1 | 9/2017 | Staton et al. | |
| 2001/0043546 A1 | 11/2001 | Kumacheva et al. | |
| 2002/0096985 A1* | 7/2002 | Hazzard | G02B 5/32 313/112 |
| 2003/0214697 A1 | 11/2003 | Dathaler et al. | |
| 2005/0011710 A1 | 1/2005 | Hitchcock et al. | |
| 2005/0166956 A1 | 8/2005 | Aisenbrey | |
| 2006/0039181 A1* | 2/2006 | Yang | G02B 26/026 365/154 |
| 2006/0123730 A1 | 6/2006 | Wambaugh | |
| 2006/0157103 A1 | 7/2006 | Sheats | |
| 2007/0138583 A1 | 6/2007 | Ofek | |
| 2008/0042012 A1 | 2/2008 | Callahan et al. | |
| 2008/0128286 A1 | 6/2008 | Wu et al. | |
| 2008/0139722 A1 | 6/2008 | Shefelbine | |
| 2008/0182056 A1 | 7/2008 | Bakker et al. | |
| 2008/0196346 A1 | 8/2008 | Gibbs | |
| 2008/0202584 A1 | 8/2008 | Basol | |
| 2009/0050428 A1 | 2/2009 | Kloucek | |
| 2009/0326140 A1 | 12/2009 | Shimada | |
| 2010/0089772 A1 | 4/2010 | Deshusses | |
| 2010/0108306 A1 | 5/2010 | Cooper | |
| 2010/0325976 A1 | 12/2010 | Degenfelder | |
| 2011/0051775 A1 | 3/2011 | Ivanov | |
| 2011/0171137 A1 | 7/2011 | Patolsky | |
| 2012/0017972 A1 | 1/2012 | Jenkins | |
| 2012/0043310 A1 | 2/2012 | Wuchert | |
| 2012/0050838 A1* | 3/2012 | Hirano | G02F 1/155 359/273 |
| 2012/0204927 A1 | 8/2012 | Peterson | |
| 2013/0212959 A1 | 8/2013 | Lopez | |
| 2014/0098420 A1 | 4/2014 | Chung | |
| 2014/0118814 A1* | 5/2014 | Uhm | G02F 1/155 359/273 |
| 2015/0277125 A1 | 10/2015 | Hirano et al. | |
| 2015/0288321 A1 | 10/2015 | Schick | |
| 2016/0040743 A1 | 2/2016 | Staton | |
| 2016/0163913 A1 | 6/2016 | Gonzalez | |
| 2016/0250612 A1 | 9/2016 | Oldenburg et al. | |
| 2016/0324016 A1* | 11/2016 | Bellman | C03C 17/3417 |
| 2016/0363727 A1 | 12/2016 | Suntsova | |

OTHER PUBLICATIONS

PCT Appln. No. PCT/US18/12643, International Search Report and Written Opinion, dated Mar. 7, 2018, 9 pages.

Lakes et al., "Analysis of High Volume Fraction Irregular Particulate Damping Composites", ASME, vol. 24, Apr. 2002, pp. 174-178I.

* cited by examiner

METHOD OF CONVERTING A STATIC DISPLAY TO A CHANGING DISPLAY

CROSS-REFERENCE TO RELATED APPLICATIONS

This application claims priority to U.S. Provisional Patent Application No. 62/653,037, filed Apr. 5, 2018, the disclosure of which is incorporated herein by reference in its entirety.

BACKGROUND

Embodiments of the invention relate generally to signage. More specifically, the invention is directed to thin-walled changing displays that may be used to enhance the current capabilities of static and/or dynamic signage.

SUMMARY

The following presents a simplified summary of the invention in order to provide a basic understanding of some aspects of the invention. This summary is not an extensive overview of the invention. It is not intended to identify critical elements of the invention, or to delineate the scope of the invention. Its sole purpose is to present some concepts of the invention in a simplified form as a prelude to the more detail description that is presented elsewhere.

In one embodiment, a thin-walled dynamic display includes a first layer, a second layer, and an intervening layer. The first layer includes a plurality of SPEC particles configured to selectively switch between a colored-1 state and a colored-2 state. The first and second layers are located at opposing sides of the intervening layer.

In another embodiment, a thin-walled display system includes a first layer having a plurality of SPEC particles configured to selectively switch between a colored-1 state and a colored-2 state. A second layer includes a cutout area, and is positioned substantially adjacent the first layer. A third protective layer is positioned substantially adjacent the second layer to protect the first and second layers.

According to a further embodiment, a method of converting a sign to a changing display includes first identifying an area of the sign to convert. A particle sheet is at the area of the sign, and a communication sheet is placed over the particle sheet. The particle sheet has a first layer comprising a plurality of three-dimensional SPEC particles; a second layer comprising a positively charged conductive sheet; a third layer comprising a negatively charged conductive sheet; a laminate layer; and a control element comprising a processor for activating the SPEC particles to switch from a first colored state to a second colored state. The second and third layers are positioned on either side of the first layer, and the laminate layer encompasses the first, second, and third layers. The particle sheet is activated to cause the SPEC particles to selectively flash between the first colored state and the second colored state.

DETAILED DESCRIPTION

Signage appears nearly everywhere to grab people's attention and focus their interest on a particular product, location, or service. Signs are often also used to provide information to viewers, such as speed limits, work zones, etc. Because signs are everywhere, people frequently ignore the signs, and therefore miss the information on the display. While this may not always have serious consequences, in some instances, a person's failure to recognize the important information on a sign can be catastrophic.

In an attempt to draw important information out of a sign and into focus for a viewer, sign designers and manufacturers have incorporated the use the bright colors, reflective patterns, and flashing lights, for example. While this may be effective, each has various drawbacks. For example, bright colors can grab the attention of a viewer, but as a viewer is accustomed to seeing signs everywhere, the viewer is accustomed to seeing signs with bright lights. Lights also require a power source, so the signs must usually be located near an electric outlet. Similarly, reflective materials hardly have the sort of awe-inducing effect that is desired to gain a viewer's attention, due at least in part to the fact that such materials are so frequently used. And flashing lights, such as LEDs which may be placed in or around a sign, also require a power source.

Still further, lighted signs transmit light directly into the observer's eyes which can cause viewing fatigue. Often, lighted signs are multiplexed (e.g., row and column scanned) LED, LCD, oLED, etc., which can distract the viewer unintentionally and sometimes dangerously through the viewer's peripheral vision based on ambient variations in persistence of vision. The presence of multiple lighted signs in one viewing area may also lead to scanning beat-frequency image flickering and cause viewer anxiety. It would be desirable to have a sign with changing-display capabilities that can be for use in many different industries, and requires little power.

Embodiments of changing displays are described herein which are programmable, low-powered, and incorporate reflective or transflective semi-permanent memory. As is described in greater detail below, the display may be part of a distributed system, or may be standalone. Additionally, the displays be configured for use anywhere signage may be desirable—on vehicles, billboards, or clothing, in agricultural plots, as a sensor-enabled display on shipping containers, or refrigerators, and/or anywhere else where such signage is used.

Figure 1:
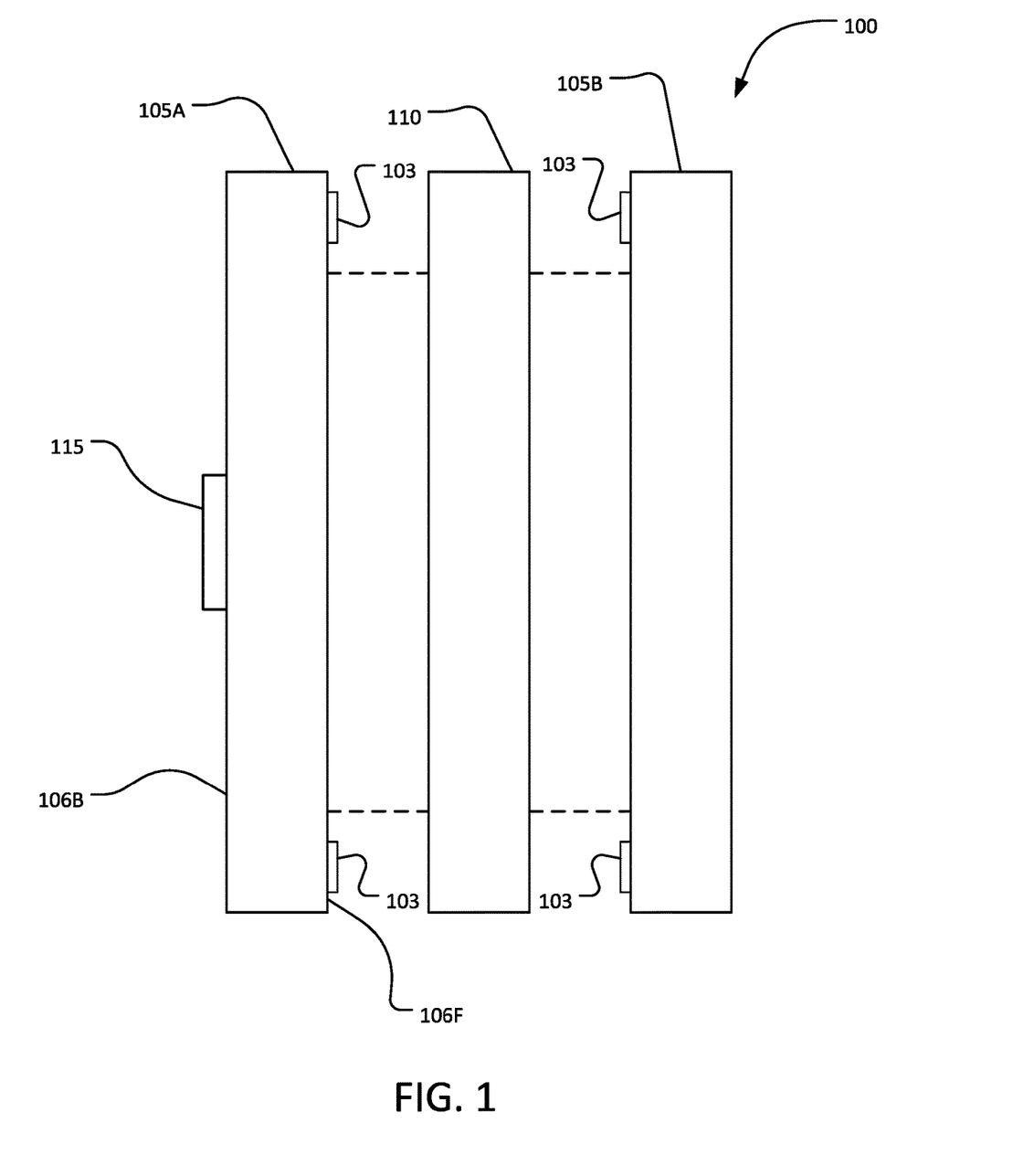
FIG. 1 is a side view of a thin-walled changing display according to embodiments of the invention.

Referring now to FIG. 1, in some embodiments, a sign 100 contains a first layer 105A spatially separated from a second layer 105B. A third layer, 110, is distributed between the first and second layers 105A and 105B. The first layer 105A is a particle layer. The particle layer 105A may include a front side 106F and a back side 106B. A plurality of static programmable electrochromic (SPEC) particles is deposited at the front side 106F and/or the back side 106B, for example, as a slurry. The SPEC particles may be three-dimensional electrochromic, thermochromic, photochromic, electro-emissive, and/or electroluminescent particles.

The SPEC particles may form a non-volatile, semi-permanent SPECink that responds to a stimulus (e.g., electrical, magnetic, electromagnetic, thermal, temporal, geospatial, optical, holographic, etc.) causing the particles to switch between a first colored-state (e.g., a yellow state) and a second colored-state (e.g., a white-state). The SPECink is considered semi-permanent because, once the SPEC particles have switched, e.g., from the colored-2 state to the colored-1 state (or vice versa), the SPEC particles remain in that state until a stimulus causes the SPEC particles to switch to the other state (e.g., from the colored-1 state to the colored-2 state).

In embodiments, different color combinations of SPEC particles may be included in the slurry. For example, the slurry may include a plurality of a first configuration of SPEC particle (e.g., having a color-1 and a color-2 combination), and a plurality of a second configuration of SPEC particle (e.g., having a color-1 and a color-3 combination). Here, color-1 may be black, color-2 may be white, and color-3 may be yellow. The SPEC particles may be provided at a ratio of 50:50 first configuration:second configuration, or any other appropriate ratio to provide the desired effect. In embodiments, a ratio of first configuration SPEC particles to second configuration SPEC particles is about 0:100, 10:90, 20:80, 30:70, 40:60, 50:50, 60:40, 70:30, 80:20, or 90:10, 100:0. In still other embodiments, three-color SPEC particles may be utilized, wherein the SPEC particle may selectively switch between a color-1 state, a color-2 state, and a color-3 state. The various configurations of SPEC particles may allow for scanning modes of operation based on reflective, transmissive, or emitted wavelengths of energy (e.g. reflected light, transmitted filtered light, transflective light, color hue, emissivity of IR thermal energy wavelengths, black-light, electroluminescence, UV, vibration, haptics, laser, etc.)

Figure 1A:
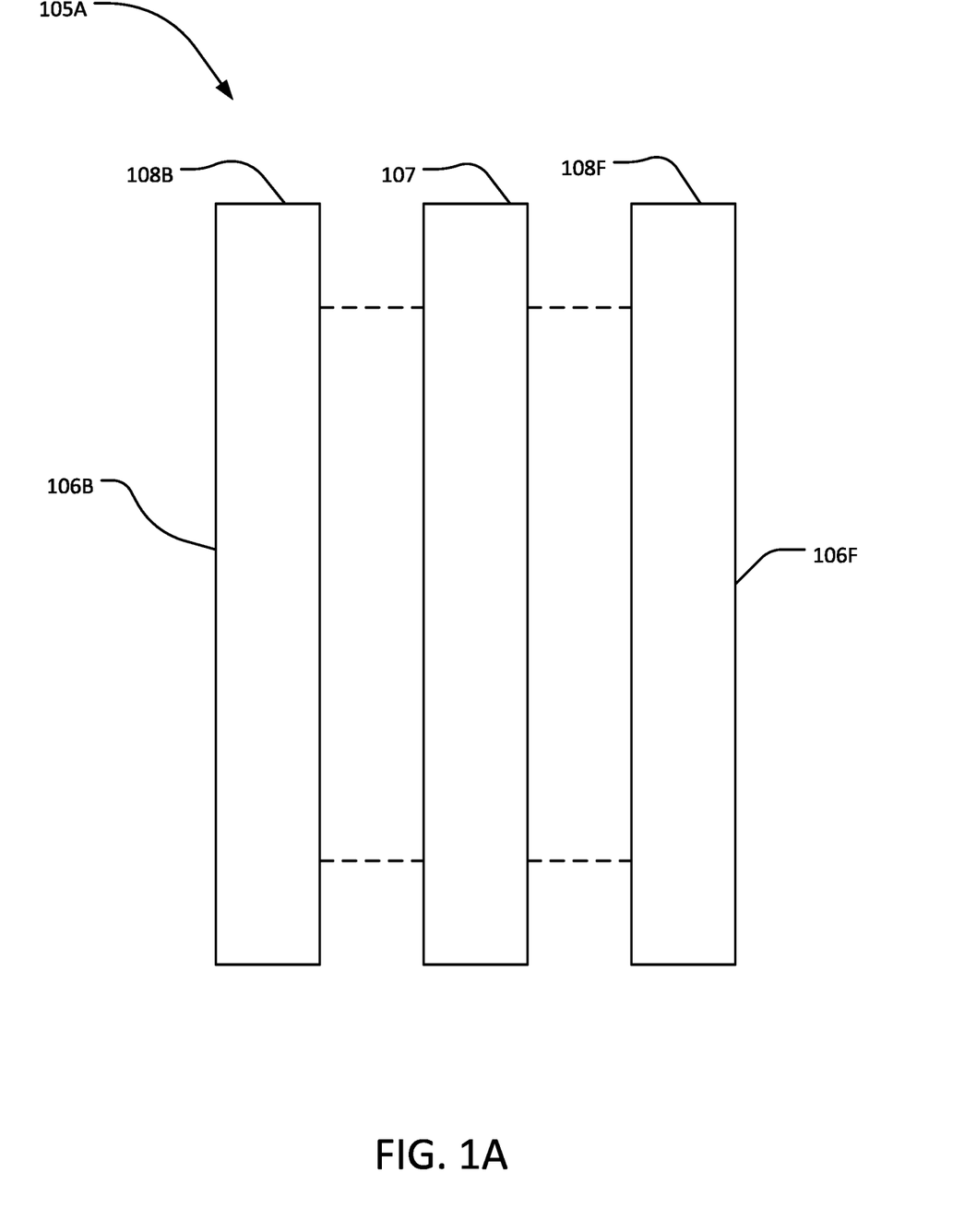
FIG. 1A is a side view of one layer of the thin-walled changing displays according to other embodiments of the invention.

The layer 105A may include a plurality of sublayers. FIG. 1A shows the layer 105A which includes a front protective layer 108F and a back protective layer 108B. The SPECink may be deposited on a substrate 107 positioned between the respective protective layers 108F and 108B. The protective layers 108F, 108B may allow the SPECink to remain substantially moist such that the particles remain suspended in the slurry and capable of changing configurations as described herein. In some embodiments, the protective layer(s) 108F and/or 108B are coatings which may be sprayed atop the substrate 107 having the SPECink thereon. In other embodiments, the protective layer(s) 108F and/or 108B are laminate.

The layer 105A may be configured to temporarily adhere to a surface. For example, the layer 105A may include one or more areas of adhesive or adhering elements 103 (e.g., suction cups and the like) at the front surface 106F to allow the layer 105A to attach to the surface. In embodiments, the front surface 106FA may include a transparent layer of cling vinyl or other similar material. The cling vinyl may be in addition to the front protective layer 108F, or may replace the front protective layer 108F altogether. The cling vinyl may eliminate the need for adhering elements 103.

In some embodiments, the layer 105A may be a silk screen or a screen print (e.g., direct ink print). Here, the SPECink may be applied according to screen printing techniques commonly used by those of skill in the art. More specifically, the SPECink need not fill the entire substrate 107, but may be applied in a particular pattern or image, as desired.

Figure 1B:
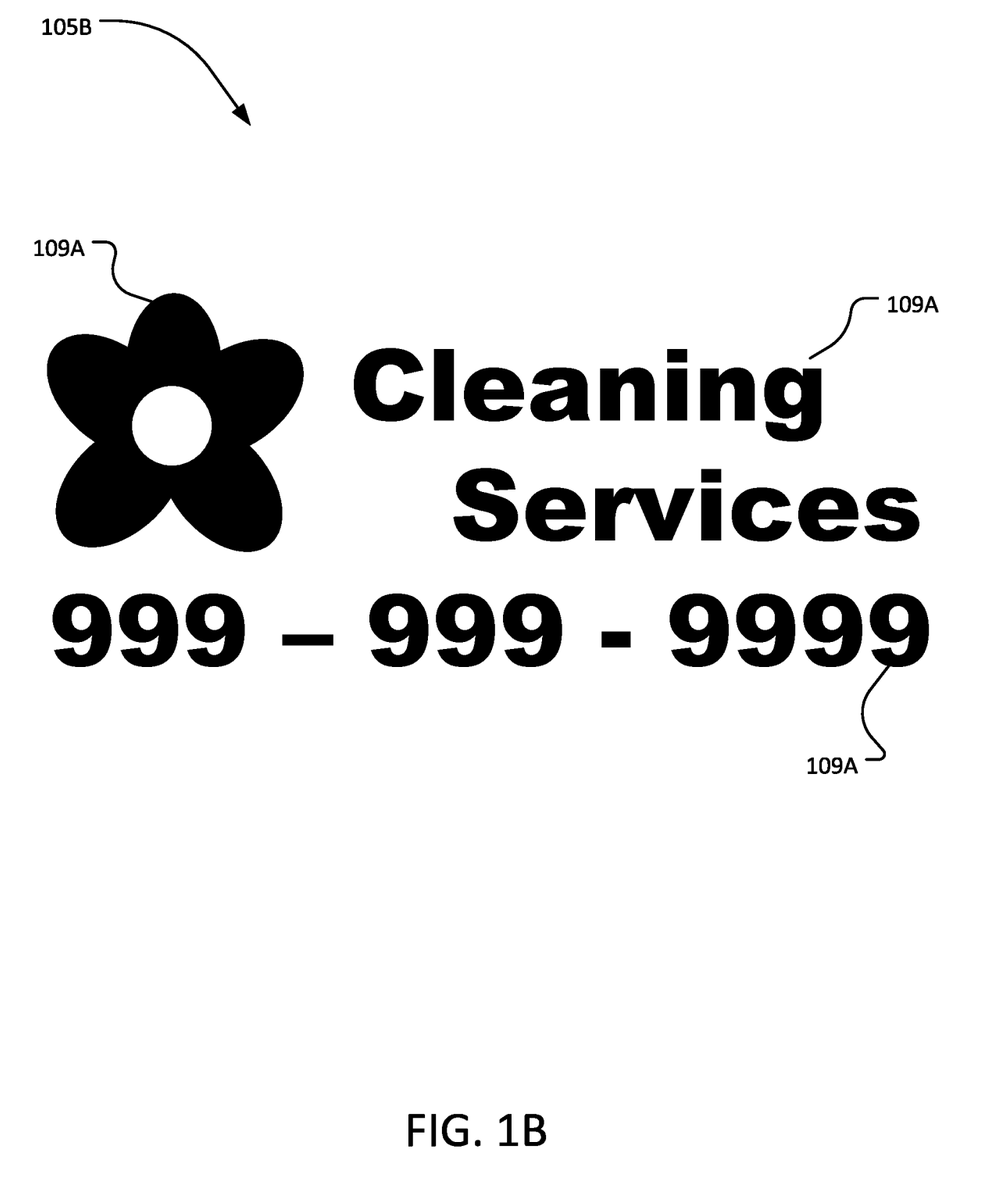
FIG. 1B is a front view of one layer of the thin-walled changing display according to various embodiments of the invention.
Figure 1C:
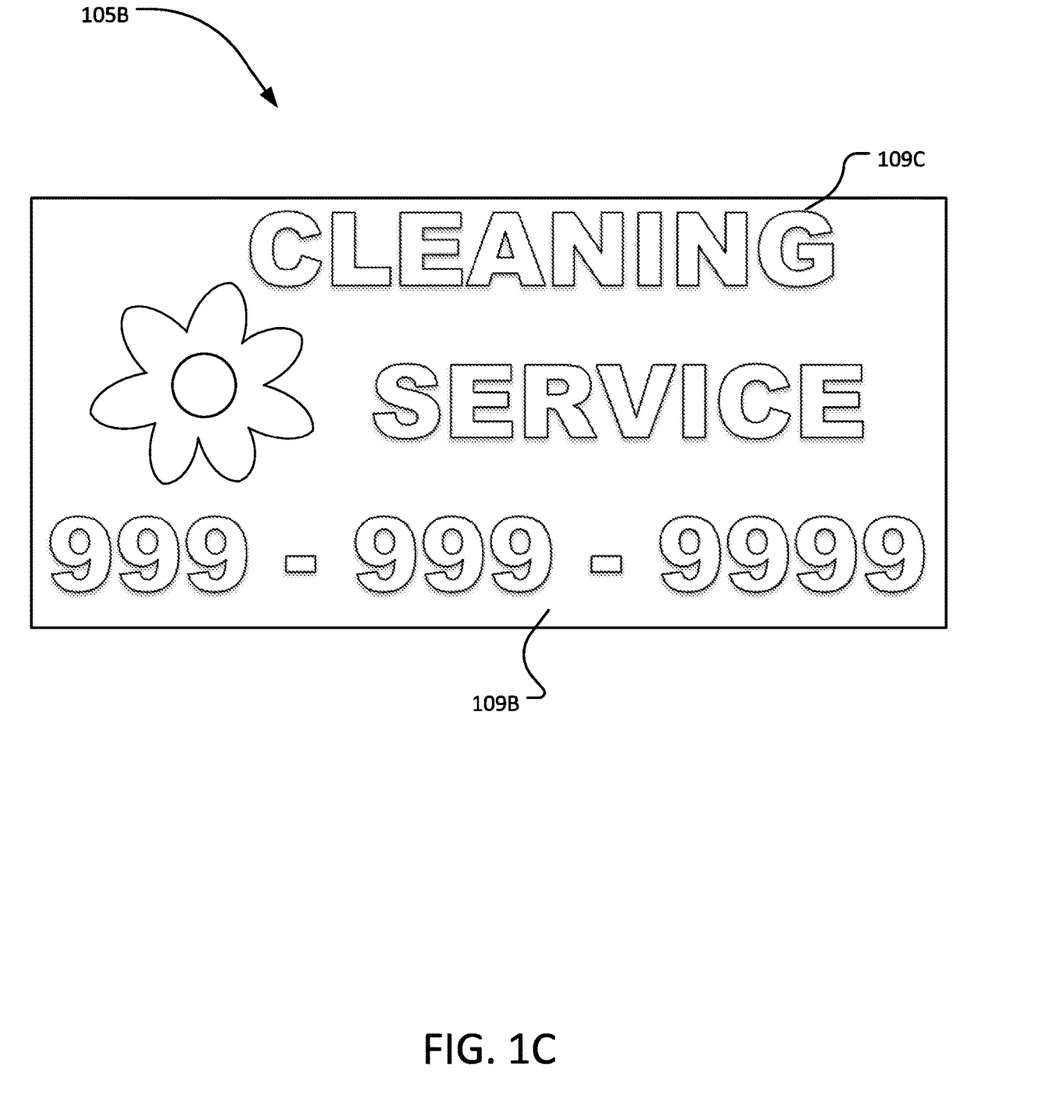
FIG. 1C is a front view of one layer of the thin-walled changing display according to some embodiments of the invention.
Figure 3:
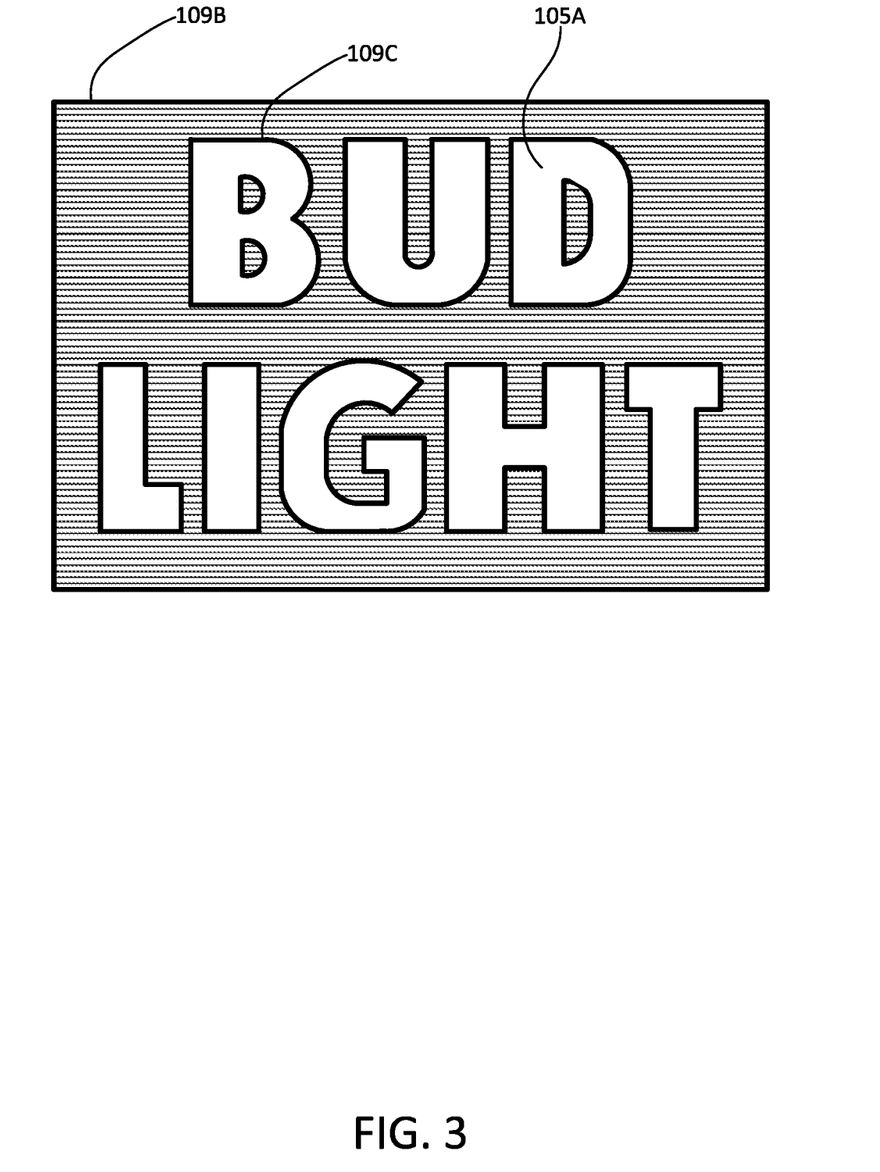
FIG. 3 is a front view of a first configuration of a thin-walled changing display according to still another embodiment of the invention.
Figure 4:
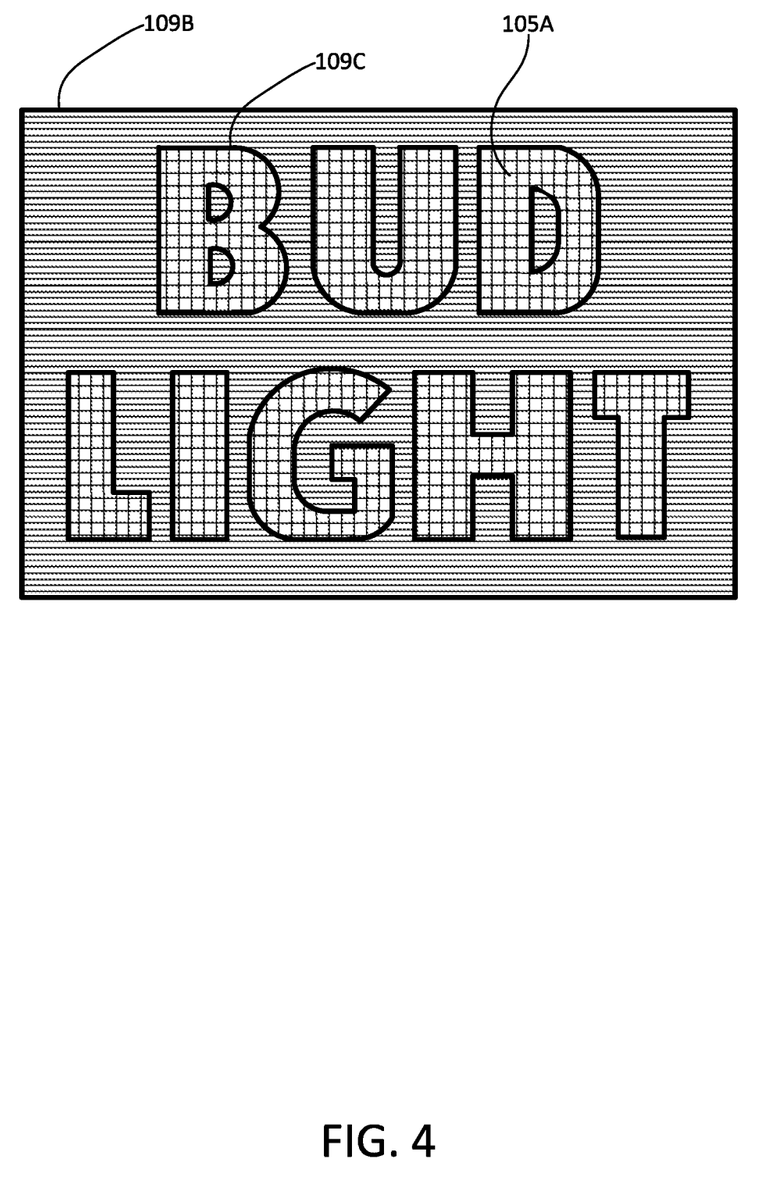
FIG. 4 is a front view of a second configuration of a thin-walled changing display according to the embodiment of FIG. 3.
Figure 5:
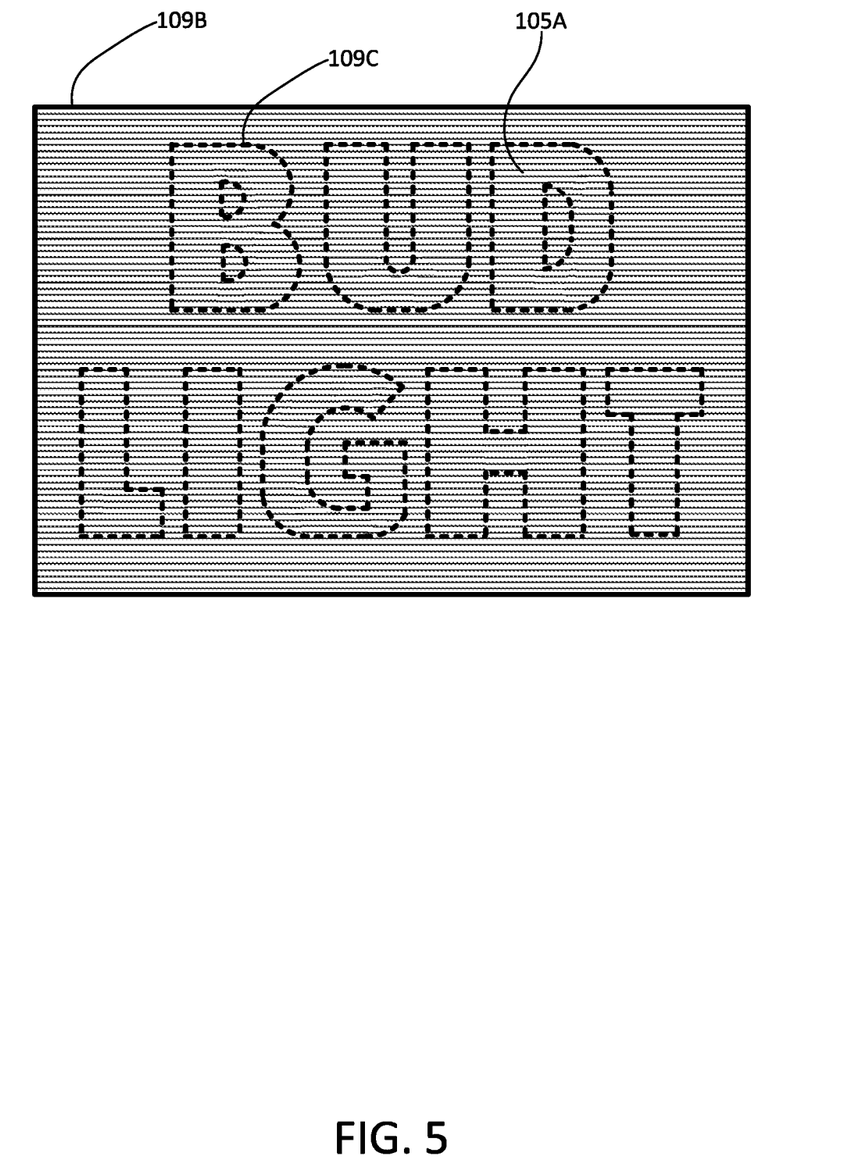
FIG. 5 is a front view of a third configuration of a thin-walled changing display according to the embodiment of FIG. 3.
Figure 6:
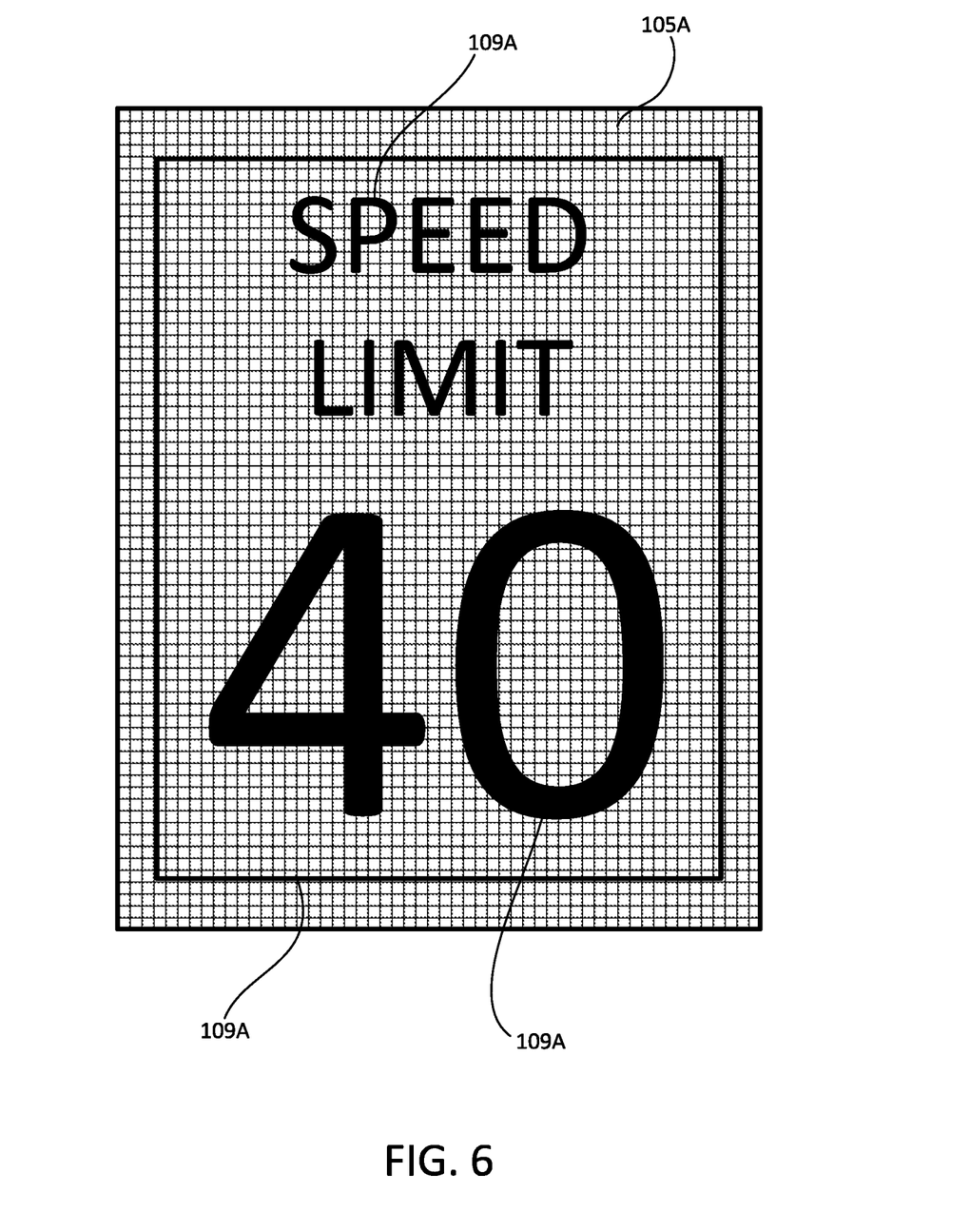
FIG. 6 is a front view of a first configuration of a thin-walled changing display according to a further embodiment of the invention.
Figure 7:
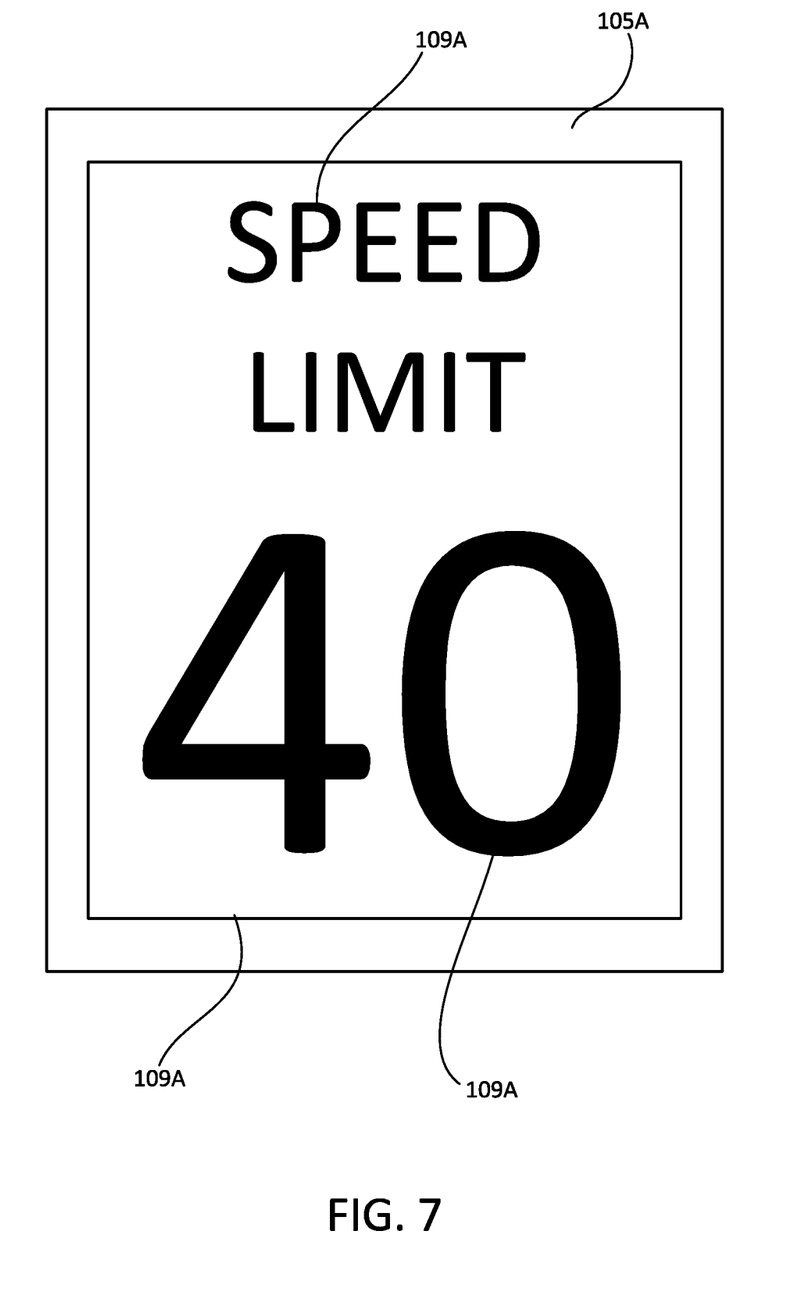
FIG. 7 is a front view of a second configuration of a thin-walled changing display according to the embodiment of FIG. 6.
Figure 8:
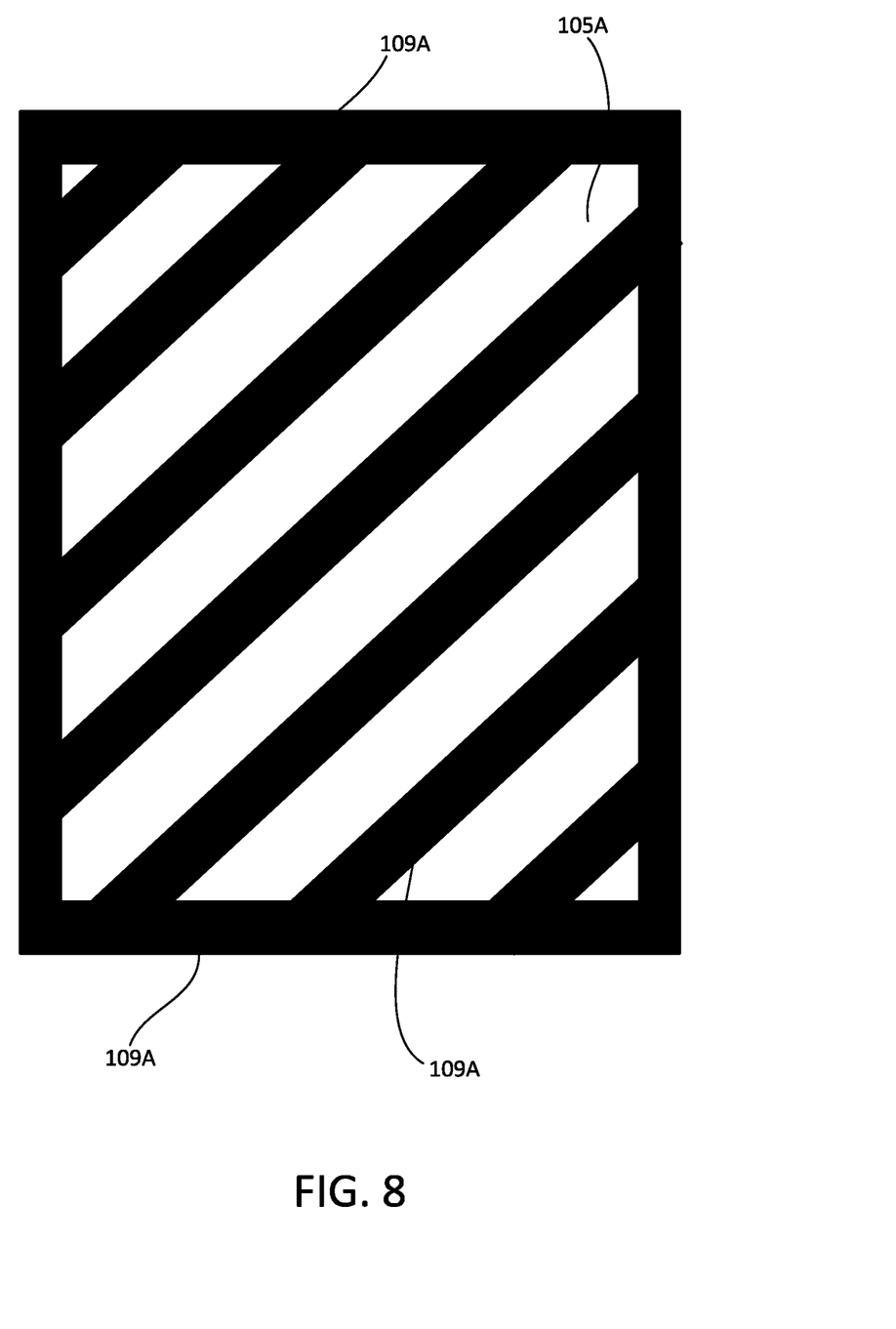
FIG. 8 is a front view of a first configuration of a thin-walled changing display according to still another embodiment of the invention.
Figure 9:
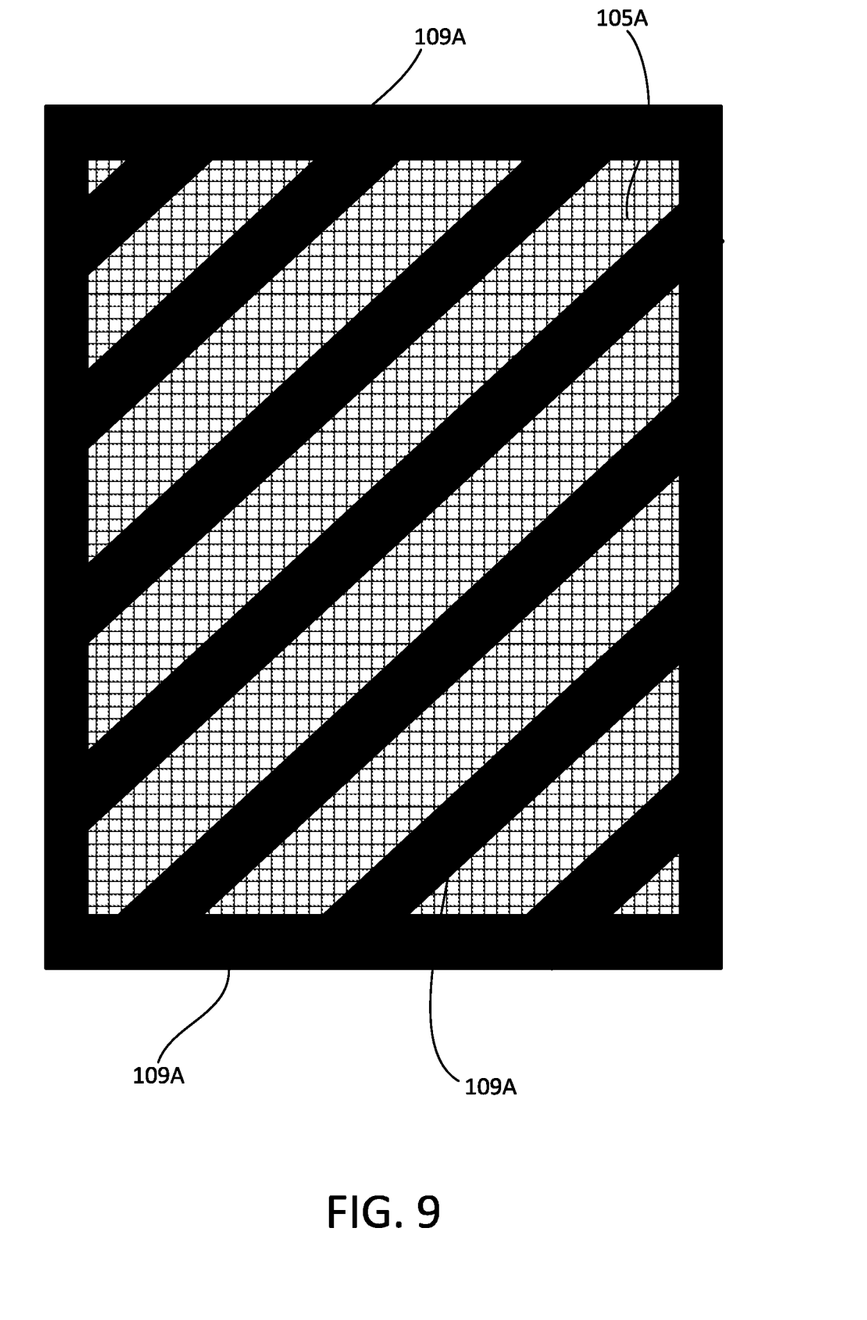
FIG. 9 is a front view of a second configuration of a thin-walled changing display according to the embodiment of FIG. 8.

The second layer 105B may include a laminate layer, such as a vinyl laminate, although the layer 105B is not necessarily laminate or vinyl. The layer 105B may be configured as an aesthetic layer. As shown in FIG. 1B, in some embodiments, the laminate layer 105B includes a plurality of separate portions 109a that can be independently arranged to provide a desired image, word, phrase, et cetera. FIGS. 6-9 illustrate exemplary embodiments of a layered display having a layer 105B with multiple portions 109a arranged to form road signs. As shown in FIG. 1C, in other embodiments, the laminate layer 105B is a single piece 109b having one or more cutouts 109c formed therein to provide a message to onlookers. FIGS. 3-5 illustrate an exemplary embodiment of a layered display having a layer 105B with multiple cutouts 109c. Here, the layer 105B is a wall of a container, such as a box for holding beverages. An additional protective layer may but need not be provided over the layer 105B.

In some embodiments, the layer 105B may adhere or otherwise attach to a surface, similar to layer 105A. Accordingly, the laminate layer 105B may include adhering elements 103. It shall be understood that the adhering elements 103 of the first layer 105A do not need to be the same as the adhering elements 103 of the second layer 105B. In embodiments, the layer 105B is cling vinyl. In further embodiments, the layer 105B may be transparent, or semi-transparent. Further, the layer 105B may additionally include one or more areas of SPEC particles.

The intervening layer 110 may be a transparent surface, such as a window or a door. The intervening layer 110 may, but need not, be glass. In embodiments, the intervening layer 110 is a windshield of a vehicle. According to some embodiments, the intervening layer 110 is opaque, and in still other embodiments, the intervening layer 110 is altogether omitted.

A control element 115 may be positioned at the back side 106B of the first layer 105A for providing electrical stimulation to the SPECink to selectively cause the SPEC particles to switch between configurations. In some embodiments, the control element 115 is a solar cell. In other embodiments, the control element 115 may be an integrated circuit, a flexible film circuit board (e.g., Kapton), or any other electrical device now known or later developed that can harvest energy and/or provide electrical stimulation to the particle layer 105A. The control element 115 may include a programming that, when activated, causes the SPEC particles to switch between the colored-1 state and the colored-2 state. In an embodiment, the programming causes the SPEC particles to switch according to a predetermined time interval. It shall be understood by those of skill in the art that the control element 115 (or other electronic components, as the case may be) does not have to be positioned on a back side 106B of the layer 105A, and indeed, it may be beneficial for the control element 115 to be distributed away from the back side 106B (e.g., so as to have better to exposure to sunlight). However, the control element 115 may be electrically coupled to the layer 105A so as to provide electrical stimulation (e.g., conduction, capacitance, induction, radiation, pulse-width-modulation, etc.) to the SPEC particles as described herein.

Figure 1D:
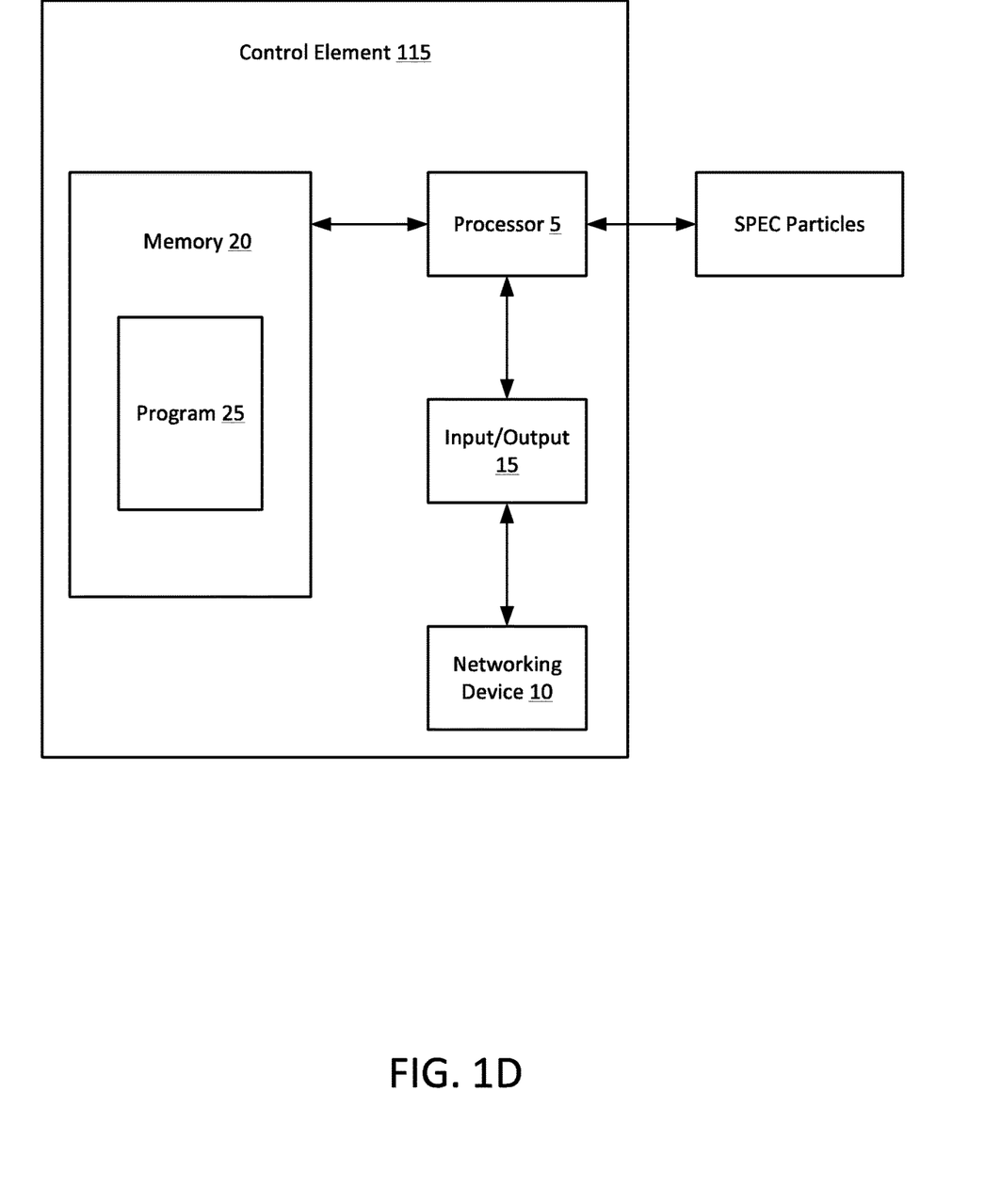
FIG. 1D is a schematic of a control element according embodiments of the invention.

Accordingly, as illustrated in the schematic of FIG. 1D, the control element 115 may include a processor 5 communicatively coupled to a networking device 10, one or more input/output devices 15, and computer memory 20. The processor 5 may be configured through particularly configured hardware, such as an application specific integrated circuit (ASIC), field-programmable gate array (FPGA), etc., and/or through execution of software (e.g., program 25) to perform functions in accordance with the disclosure herein.

Memory 20 represents one or more of volatile memory (e.g., RAM) or non-volatile memory (e.g., ROM, FLASH, magnetic media, optical media, etc.). Although shown within the control element 115, the memory 20 may be, at least in part, implemented as network storage external to the control element 115 which may be accessed via the network device 10. The network device 10 may be implemented as one or both of a wired network interface and a wireless network interface (e.g., Wi-Fi, Internet, Bluetooth, 5G, etc.), as is known in the art.

The network device 10 may allow the control element 115 to communicate over a network. The network may be a wireless network, such as Wi-Fi, Bluetooth, 5G, Ethernet, PoE, or other wireless (or wired) network.

Program 25 may be stored in a transitory or non-transitory portion of the memory 20. Program 25 includes machine readable instructions that, when executed by the processor 5, perform one or more of the functions of the control element 115. In embodiments, the program 25 may include instructions for causing the SPEC particles to switch between a first colored state and a second colored state, as described herein.

The input/output device 15 may include one or more input and/or output devices which may be embodied in a single device or multiple devices. In some embodiments, the input/output device 15 includes at least an output device appropriately configured to output an electrical stimulus to the first layer 105A.

In use, the first layer 105A is secured to an inside surface of the intervening layer 110 via to the adhering element(s) 103. The control element 115 may, if not directly attached to the layer 105A, be appropriately positioned and secured into place to allow for electric coupling with the first layer 105A. The second layer 105B may be situated on an outside surface of the intervening layer 110 in an area generally corresponding to the first layer 105A. Once the respective layers 105A and 105B are positioned, the control element 115 may be activated to begin providing electrical stimulus to the SPEC particles. The stimulus may cause the SPEC particles to change between a colored-1 state and a colored-2 state. The programming may be such that the control element 115 only operates during business hours, during sunlight hours, when there is movement in an area near the display 100, for example. Accordingly, in embodiments, the control element 115 may include a sensor as an input/output device 15, such as a photosensor, motion detector, etc. It shall be understood that the sensor 15 may be located at or near the display 100 and operatively coupled to the processor 5.

Figure 2:
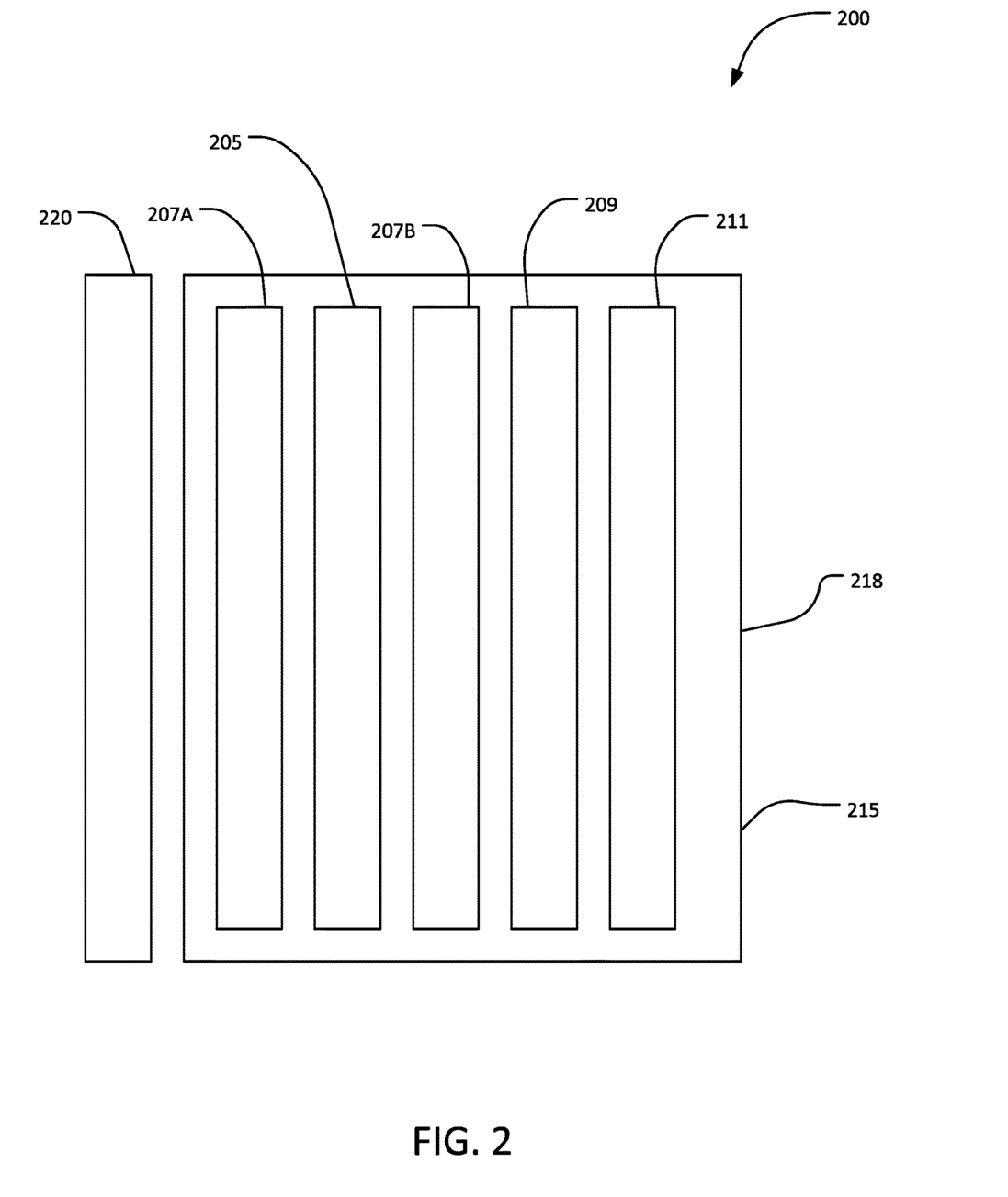
FIG. 2 is a side view of another thin-walled changing display according to another embodiment of the invention.

In another embodiment, illustrated in FIG. 2, a layered display 200 includes a particle layer 205, a first transparent conductive sheet 207A (e.g., having a layered positive charge), a second transparent conductive sheet 207B (e.g., having a layered negative charge), an optional reflective layer 209, and an optional electroluminescent layer 211. One or more of the layers (e.g., the reflective layer 209 and/or the electroluminescent layer 211) may not be included, depending on the desired utility of the display 200. The various layers 207A, 207B, 209, and 211 may be covered in a laminate layer 215 for protection.

Similar to embodiment 100, the display 200 may include control elements necessary to trigger the switching of the particles. Here, the conductive sheets 207A, 207B have respective positive and negative charges such that, when the stimulus from the control element is applied, the pigmented bits of the SPEC particles are persuaded to one of the conductive sheets, thereby causing the apparent color of the particle layer 205 to change.

Indirect coupling methods can be used to conduct through the conductive sheets 207A, 207B to excite SPEC particles within the inner layers. Stimulus such as electrical charges and excitation may be realized through electric conduction, near-field propagation, far-field reception, capacitive coupling, inductive coupling, electromagnetic coupling, electrochemical transducing, photoelectric transducing, or other energy transfer techniques.

The stimulus may be provided via an input of the control element(s), such as a flexible film circuit board, in communication with the conductive sheets 207A and 207B. In embodiments, the flexible firm circuit board may form a part of the sheet 200. The circuit board may be activated via a switch located directly on the sheet 200. In other embodiments, the circuit board may be activated via a remote in communication with the circuit board. Electrical charge stimulus may be provided by means of direct conductive connection as well as alternative connections such as other coupling methods. For example, capacitive coupling can be used by placing one or more energy excitation plates externally to the sheet 200 in a parallel plane while providing a strategic waveform (e.g., PWM, AM, FM, QAM, OFDM, etc.) of energy to provide an integration of average energy levels to charge the particles to the desired state. It is important to note that a more indirect coupling method could be realized by utilizing radio-frequency (RF) coupling where the front and/or back surfaces of the sheet 200 become the antenna through wavelength matching and the inner layer circuitry may be a simple diode detector that receives an integrated envelope of excitation electrical charge to switch the particles. The diode detector as well as the resistive-capacitive integrator receiver could be constructed utilizing nano-particles such as graphene and carbon nanotubes as described in U.S. Pat. No. 9,759,286, which is incorporated herein by reference in its entirety.

The conductive sheet 207A and/or 207B may be constructed of a splattered or deposited transparent conductive particle array onto a traditional plastic, rigid, or semi-flexible surface. Alternately, the conductive sheet layers 207A and/or 207B may consist of a spray coating layer that is layered during manufacturing of the sheet 200 in the proper order as to achieve a functional layered assembly. One or more of the conductive layers 207A, 207B may also be opaque and consist of a metal or conductive surface such as carbon, copper, aluminum, or steel. The front surface conductive sheet 207A or 207B may also be constructed of non-conductive or conductive materials such as Kapton, Mylar, polycarbonate, acrylic plastic, or transparent aluminum (e.g., as described in U.S. patent application Ser. No. 15/863,558 which is incorporated herein by reference in its entirety).

A magnetic layer 218 may be applied to one or more sides (e.g., a back side) of the sheet 200 to allow the sheet 200 to be magnetically attached to a metal surface. In embodiments, the magnetic layer may be replaced by a cling layer, such as a vinyl cling. The vinyl cling may allow the sheet 200 to attach to metal and non-metal surfaces alike.

The sheet 200 may further include an additional layer 220, similar to layer 105B. The layer 220 may be a laminate layer, such as a vinyl laminate, although other materials may also be appropriate. The layer 220 may be configured as an aesthetic layer. In embodiments, the layer 220 includes a plurality of separate pieces that can be independently arranged. In another embodiment, the layer 220 is a single layer that includes a plurality of cutouts formed therein to provide a message to onlookers. The layer 220 may be configured to adhere or otherwise attach to the sheet 200, for example, via magnets, adhesive or other similar means.

Further optional layers may include vibrational, emissive, thermal, electrical, or chemical insulation and/or filtering layers. Such layers may be included within the laminate layer 215, or may be deposited outside the laminate layer 215.

In some embodiments, the sheet 100 may be configured for use without the transparent layer. According to one example, the sheet 100 and/or 200 is provided for use on the side of a vehicle. The sheet 100, 200 may include a magnetic layer (e.g., layer 218), which may be temporarily attached to the side of a vehicle. The outer layer 105B and/or 220, having a desired message, may be positioned above the sheet 100, 200, and the sheet 100, 200 may be activated as described herein. It shall be understood by those of skill in the art that the sheet 100, 200 may also be used in many other environments, including on billboards, walls, on road signs, incorporated into product packaging, on flags, etc.

In embodiments, sensors may be embedded within the sheet 100 or 200. The sensor may be, for example, temperature, humidity, and/or moisture sensitive, although other sensors may additionally or alternately be incorporated. The sensor may extend from the sheet 100, 200 and into an environment for monitoring. For example, the sheet 100, 200 may be adhered to a refrigerator. A sensor (e.g., as a flex cable) may extend from the sheet 100, 200 into the refrigerator to measure the temperature inside the refrigerator. The programming of the control element for the sheet 100, 200 may be programmed to provide visual indications of a malfunction with the refrigerator. For example, the sheet 100, 200 may be configured to appear neutral (e.g., a color-1 state) in a normal state. When the programming receives a temperature reading that is, for example, above a threshold value, the circuit board may activate the sheet 100, 200 causing the particles to switch from the colored-1 state to a colored-2 state. In embodiments, the particles may begin to flash. Once the temperature in the refrigerator is measured as having gone above the threshold value, the particles may remain in their "activated" state (e.g., a colored-2 state or a flashing state) until the system is reset, for example, by a user.

In further embodiments, multiple sheets 100, 200 may be included as part of a system. Each sheet 100, 200 may form a region, and each region may but need not have different colored particles, and each may have different programming. In some embodiments, the sheets 100, 200 may be communicatively coupled, e.g., over a network. For example, a first sheet may include particles with a white pigment as a colored-1 state and a red pigment as a colored-2 state, and a second sheet may include particles with a white pigment as a colored-1 state and a yellow pigment as a colored-2 state. Programming for the second sheet may be such that the particles are activated when the temperature inside the refrigerator is between two predetermined temperatures (a lower threshold value and a higher threshold value). When the temperature is below the lower threshold value, the sheets 100 may appear transparent or neutral. When the temperature is above the lower threshold value, the second sheet may be activated (e.g., showing the colored-2 state) while the first sheet remains deactivated. When the temperature is above the higher threshold value, the second sheet may be deactivated, and the first sheet may be activated (e.g., showing the colored-2 state). As noted above, an optional vinyl layer may be provided on either the first or second sheets to further communicate with a user.

In some embodiments, a clip may be disposed between respective sheets 100, 200. The clip may be configured to provide communicative coupling between the respective sheets 100, 200. Such a clip is generally described in U.S. patent application Ser. No. 15/819,800, which is incorporated herein by reference in its entirety.

According to various embodiments, the control element 115 may be further configured to communicate over a network, for example, with a user's mobile device. For example, the user may interact with the mobile device to activate the stimulus to cause a change in the state of the SPEC particles. Additionally, the mobile device itself may also incorporate one or more sheets 100, 200 as described herein. For example, a phone case may include a sheet 100, 200 disposed as one layer of the phone case. Optionally, the sheet 100, 200 is maintained in a neutral state which may appear as a colored-1 state or transparent. Sensors (e.g., vibration sensors) deposited on or in the case may detect phone vibrations. Upon detection of vibrations, the sheet 100, 200 may begin to flash, turn to a colored-2 state, or a combination thereof. A user may be able to communicate with the phone case (e.g., to cause the sheet 100, 200 to stop flashing, or to reset the sheet 100, 200 to the colored-1 state) by simply tapping on the case, or providing an alternative input thereto.

Notably, the width of the sheet 100, 200 is very thin, measuring mere millimeters. Whereas previously such a system would require bulky equipment, the layered sheet 100, 200 can be increasingly thin, allowing the sheet 100, 200 to be used in a variety of different ways. In embodiments, the layered sheet 100, 200 may be less than about 0.25", less than 0.125", and even less than 0.0625". In some embodiments, the thickness of the sheet 100, 200 is about 0.5 mm, 1 mm, or 2 mm.

It shall be further understood by those of skill in the art that the sheets 100, 200 incorporating the SPEC particles may further incorporate reflective and/or electroluminescent layers (e.g., LED, oLED, EL, or chemical glow strips) to provide additional alert capabilities. For example, the SPEC particles may be activated during the day-time hours. However, the particles may be inherently non-reflective and non-transmissive. Therefore, during night hours, having additional reflective and/or electroluminescent layers may allow a viewer to see the SPEC particles, or may provide an alternate mode of alerting the viewer.

Many different arrangements of the various components depicted, as well as components not shown, are possible without departing from the spirit and scope of the present invention. Embodiments of the present invention have been described with the intent to be illustrative rather than restrictive. Alternative embodiments will become apparent to those skilled in the art that do not depart from its scope. A skilled artisan may develop alternative means of implementing the aforementioned improvements without departing from the scope of the present invention. Further, it will be understood that certain features and subcombinations are of utility and may be employed within the scope of the disclosure. Further, various steps set forth herein may be carried out in orders that differ from those set forth herein without depart from the scope of the present methods. This specification shall not be restricted to the above embodiments.

Any units of measurement provided herein are exemplary in nature only and are not meant to specifically define the dimensions of the system. Other dimensions may be appropriate or desirable.

The invention claimed is:

1. A method of converting a static display to a dynamic display, comprising:
   identifying an exhibition area of the static display, the exhibition area being less than an entire area of the static display;
   if the exhibition area of the static display is opaque, removing the exhibition area from the static display to form a cutout area;
   placing a dynamic display sheet at one side of the display at the location of the cutout area, the dynamic display sheet comprising:
      a first layer comprising a plurality of three-dimensional static programmable electrochromic (SPEC) particles;
      a second layer comprising a positively charged conductive sheet;
      a third layer comprising a negatively charged conductive sheet;
      a laminate layer; and
      a control element comprising a processor for activating the SPEC particles to switch from a first colored state to a second colored state;
      wherein the second and third layers are respectively positioned on either side of the first layer, and the laminate layer encompasses the first layer, the second layer, and the third layer;
   placing a protective layer over the cutout area of the static display, the protective layer contacting at least a portion of the dynamic display sheet; and
   activating the dynamic display sheet to cause the SPEC particles to selectively flash between the first colored state and the second colored state.

2. The method of claim 1, wherein the control element is positioned at the first layer.

3. The method of claim 1, wherein the first layer comprises a plurality of sublayers, the sublayers comprising:
   a front protective layer;
   a back protective layer; and
   an intervening substrate, wherein the SPEC particles are deposited on the intervening substrate.

4. The method of claim 3, wherein the slurry is screen printed on the first layer.

5. The method of claim 3, wherein the SPEC particles are suspended in a slurry, the slurry being deposited on the first layer.

6. The method of claim 5, wherein the front protective layer and back protective layer form a seal around the intervening substrate.

7. The method of claim 1, wherein at least one of the second and third layers comprises a plurality of layer portions, wherein each of the layer portions is selectively secured to the first layer irrespective of the other layer portions.

8. The method of claim 1, wherein the first layer comprises an adhering element at a front side and a back side thereof, the second layer comprises an adhering element at a front side thereof, and the third layer comprises an adhering element at a back side thereof; wherein the respective adhering elements temporarily secure the second and third layers to the first layer.

* * * * *